(12) United States Patent
Zhou

(10) Patent No.: US 10,714,585 B2
(45) Date of Patent: Jul. 14, 2020

(54) GATE-ALL-AROUND FIELD-EFFECT-TRANSISTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/050,900

(22) Filed: Jul. 31, 2018

(65) Prior Publication Data

US 2019/0051729 A1 Feb. 14, 2019

(30) Foreign Application Priority Data

Aug. 8, 2017 (CN) .......................... 2017 1 0671276

(51) Int. Cl.
*H01L 29/423* (2006.01)
*H01L 29/08* (2006.01)
(Continued)

(52) U.S. Cl.
CPC ........ *H01L 29/42392* (2013.01); *B82Y 10/00* (2013.01); *H01L 21/0214* (2013.01); *H01L 21/0262* (2013.01); *H01L 21/02164* (2013.01); *H01L 21/26513* (2013.01); *H01L 21/31111* (2013.01); *H01L 29/0673* (2013.01); *H01L 29/0847* (2013.01); *H01L 29/36* (2013.01); *H01L 29/401* (2013.01);
(Continued)

(58) Field of Classification Search
CPC .................................................. H01L 29/1033
See application file for complete search history.

(56) References Cited

U.S. PATENT DOCUMENTS 9,935,014 B1 * 4/2018 Cheng ................. H01L 27/1211
2016/0141384 A1 * 5/2016 Lee ..................... H01L 29/7833
438/275

(Continued)

*Primary Examiner* — Vongsavanh Sengdara
(74) *Attorney, Agent, or Firm* — Anova Law Group, PLLC

(57) ABSTRACT

A method for fabricating a gate-all-around field-effect-transistor device includes forming a plurality of first stacked structures, each including a first sacrificial layer and a first semiconductor layer; forming a first dummy gate structure across the first stacked structures and partially covering the top and the sidewall surfaces of each first stacked structure, and a first sidewall spacer on each sidewall surface of the first dummy gate structures; forming a first source/drain doped layer, and a dielectric structure exposing the top surfaces of the first dummy gate structure and each first sidewall spacer; removing the first dummy gate structure to form a first trench; removing a portion of the first sacrificial layer to form a first via which partially exposes the first source/drain doped layer; forming a first barrier layer on the first source/drain doped layer; and forming a first gate structure to fill the first trench and the first via.

19 Claims, 7 Drawing Sheets

(51) Int. Cl.
- *H01L 29/66* (2006.01)
- *H01L 21/02* (2006.01)
- *H01L 21/311* (2006.01)
- *H01L 29/36* (2006.01)
- *H01L 21/265* (2006.01)
- *H01L 29/06* (2006.01)
- *H01L 29/78* (2006.01)
- *H01L 29/786* (2006.01)
- *H01L 29/40* (2006.01)
- *B82Y 10/00* (2011.01)
- *H01L 29/775* (2006.01)
- *H01L 29/165* (2006.01)
- *H01L 21/3213* (2006.01)

(52) U.S. Cl.
CPC .... *H01L 29/6656* (2013.01); *H01L 29/66439* (2013.01); *H01L 29/66545* (2013.01); *H01L 29/66742* (2013.01); *H01L 29/66795* (2013.01); *H01L 29/775* (2013.01); *H01L 29/785* (2013.01); *H01L 29/7848* (2013.01); *H01L 29/78681* (2013.01); *H01L 29/78684* (2013.01); *H01L 29/78696* (2013.01); *H01L 21/31116* (2013.01); *H01L 21/32135* (2013.01); *H01L 29/165* (2013.01)

(56) References Cited

U.S. PATENT DOCUMENTS

| | | | |
|---|---|---|---|
| 2016/0204195 A1* | 7/2016 | Wen | H01L 21/02532 257/347 |
| 2016/0211322 A1* | 7/2016 | Kim | H01L 29/66795 |
| 2016/0240652 A1* | 8/2016 | Ching | H01L 21/283 |
| 2016/0293742 A1* | 10/2016 | Watanabe | H01L 29/7371 |
| 2017/0005106 A1* | 1/2017 | Zhang | H01L 29/42392 |
| 2017/0221708 A1* | 8/2017 | Bergendahl | H01L 29/66545 |
| 2017/0345915 A1* | 11/2017 | Coquand | H01L 21/02532 |
| 2017/0352659 A1* | 12/2017 | Basker | H01L 29/66795 |
| 2017/0358665 A1* | 12/2017 | Song | H01L 29/0676 |
| 2018/0138289 A1* | 5/2018 | Rachmady | H01L 29/66545 |
| 2018/0254329 A1* | 9/2018 | Guillorn | H01L 29/42364 |
| 2019/0027570 A1* | 1/2019 | Ching | H01L 29/165 |
| 2019/0221641 A1* | 7/2019 | Glass | B82Y 10/00 |

* cited by examiner

US 10,714,585 B2

GATE-ALL-AROUND FIELD-EFFECT-TRANSISTOR DEVICES AND FABRICATION METHODS THEREOF

CROSS-REFERENCES TO RELATED APPLICATIONS

This application claims the priority of Chinese Patent Application No. CN201710671276.6, filed on Aug. 8, 2017, the entire content of which is incorporated herein by reference.

FIELD OF THE DISCLOSURE

The present disclosure generally relates to the field of semiconductor fabrication technology and, more particularly, relates to gate-all-around field-effect-transistor devices and fabrication methods thereof.

BACKGROUND

With the rapid development of semiconductor manufacturing technology, field-effect-transistors (FETs) have been developed toward a direction of having a higher component density and a higher integration level, and the gate size of planar transistors has also become smaller and smaller. As the size of traditional planar transistors is continuously reduced, the ability of traditional planar transistors in controlling the channel currents becomes weaker, resulting in the short-channel effect (SCE) and causing leakage currents, which ultimately affect the electrical performance of the FETs.

Gate-all-around (GAA) FETs can effectively suppress the SCE. In a GAA FET, the channel of the device is surrounded by the gate, which is conducive to improving the ability of the gate of the GAA FET in controlling the channel current. Therefore, the sub-threshold characteristics may be improved, and thus the SCE may be effectively suppressed. As such, the size of the transistor may be further reduced. In the meantime, the improvement of the sub-threshold characteristics may also be conducive to reducing the thickness of the gate dielectric, and thus reducing the gate leakage current.

However, as the density of GAA FETs increases and the size shrinks, the fabrication process for GAA FETs becomes more and more difficult, and the performance of the GAA FETs may be degraded and the reliability may decrease. For example, in order to improve the forward conductive characteristics of a GAA FET, the concentration of the doped ions in the source/drain doped regions may be increased, which may increase the risk of junction leakage, and thus degrade the electric performance and the stability of the GAA FET.

The disclosed GAA FET devices and fabrication methods thereof are directed to solve one or more problems set forth above and other problems in the art.

BRIEF SUMMARY OF THE DISCLOSURE

One aspect of the present disclosure provides a method for fabricating a gate-all-around (GAA) field-effect-transistor (FET) device. The method includes providing a base substrate and forming a plurality of first stacked structures on the base substrate. Each first stacked structure includes a first sacrificial layer and a first semiconductor layer formed on the first sacrificial layer. The method includes forming a first dummy gate structure across the plurality of first stacked structures, and a first sidewall spacer on each sidewall surface of the first dummy gate structure. The first dummy gate structure is formed on a portion of the base substrate and covers a portion of a top surface and a portion of each sidewall surface of the plurality of first stacked structures. The method includes forming a first source/drain doped layer in the plurality of first stacked structures on each side of the first dummy gate structure and separated from the first dummy gate structure by a first sidewall spacer, and forming a dielectric structure on the base substrate to cover the plurality of first stacked structures and the first source/drain doped layer. The dielectric structure exposes a top surface of the first dummy gate structure and a top surface of each first sidewall spacer. The method also includes removing the first dummy gate structure to form a first trench in the dielectric structure, and removing a portion of the first sacrificial layer exposed in the first trench to form a first via under the first semiconductor layer. The sidewalls of the first via expose a portion of the first source/drain doped layer. The method further includes forming a first barrier layer on a portion of the first source/drain doped layer exposed by the first via, and forming a first gate structure to fill the first trench and the first via.

Another aspect of the present disclosure provides a GAA FET device. The GAA FET device includes a base substrate and a plurality of first stacked structures formed on the base substrate. Each first stacked structure includes a first semiconductor layer and a first via under the first sacrificial layer. The GAA FET device includes a first gate structure formed across the plurality of first stacked structures, and a first sidewall spacer on each sidewall surface of the first gate structure. The first gate structure is formed on a portion of the base substrate and covers a portion of a top surface and a portion of each sidewall surface of the plurality of first stacked structures, and the first gate structure also fills up the first via of each first stacked structure. The GAA FET device also includes a first source/drain doped layer formed in the plurality of first stacked structures on each side of the first gate structure and separated from the first gate structure by a first sidewall spacer, a first barrier layer formed between the first source/drain doped layer and the first gate structure, and a dielectric structure formed on the base substrate, and covering the first source/drain doped layer and exposing a top surface of the first gate structure and a top surface of each first sidewall spacer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
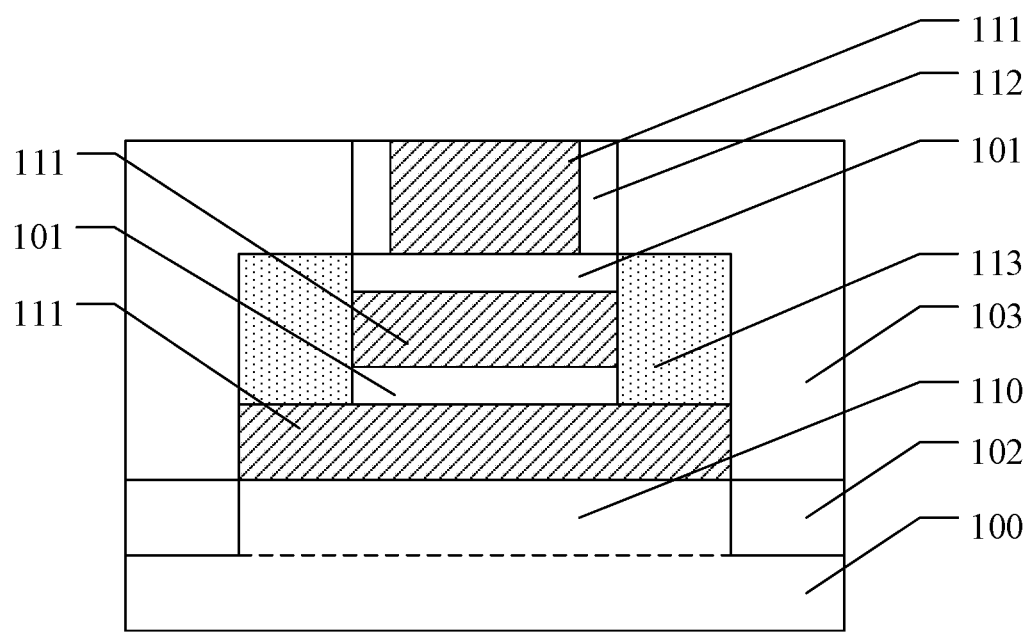
FIG. 1 illustrates a schematic cross-section view of a gate-all-around (GAA) field-effect-transistor (FET)

FIG. 1 illustrates a schematic cross-section view of a gate-all-around (GAA) field-effect-transistor (FET) device. Referring to FIG. 1, the GAA FET device includes a substrate 100, a fin structure 110 formed on the substrate 100, and a plurality of stacked semiconductor structures (not labeled) formed on the fin structure 110. Each stacked semiconductor structure includes a semiconductor layer 101 and a via (not shown) under the semiconductor layer 101. That is, the GAA FET device includes a plurality of semiconductor layers 101 and a plurality of via alternately disposed on the fin structure 110.

The GAA FET device also includes an isolation structure 102 formed on the substrate 100 and covering the sidewall surfaces of the fin structure 110, a gate structure 111 formed across the semiconductor structure and filling the vias of the plurality of stacked semiconductor structures, and a sidewall spacer 112 formed on each sidewall surface of the gate structure 111. The gate structure 111 covers a portion of the isolation structure 102 as well as a portion of the top and the sidewall surfaces of the semiconductor structure.

The GAA FET device also includes a source/drain doped region 113 formed in the semiconductor structure and on both sides of the gate structure 111 and the sidewall spacers 112, and a dielectric structure 103 formed on the isolation structure 102. The dielectric structure 103 covers the source/drain doped region 113 and exposes the top surfaces of the sidewall spacers 112 and the gate structure 111.

As the density of the GAA FETs continuously increases and the size shrinks, the charge sharing effect becomes more and more significant, and thus the short channel effect (SCE) becomes more and more severe. In order to effectively suppress the SCE and improve the sub-threshold swing (SS), the junction depth of the source/drain doped region must be reduced as the GAA FET device is shrunk. As such, the sheet resistance of the source/drain doped region 113 increases, and thus the doping concentration of the source/drain doped region 113 must be increased.

However, due to the increase in the concentration of the doping ions in the source/drain doped region 113 (which may reach 7E18 atom/cm$^3$), a concentration difference in the doping ions may exist between the source/drain doped region 113 and the gate structure 111. The doping ions may thus diffuse from the source/drain doped region 113 with the higher concentration to the gate structure 111 with the lower concentration, which may induce defects at the contact interface between the source/drain doped region 113 and the gate structure 111, and thus cause a high risk of junction leakage.

The present disclosure provides a method for fabricating a GAA FET device. FIG. 12 illustrates a flowchart of the exemplary method for fabricating a semiconductor device consistent with various embodiments of the present disclosure. FIGS. 2-11 illustrate schematic cross-section views of semiconductor structures at certain stages of the exemplary method.

Figure 2:
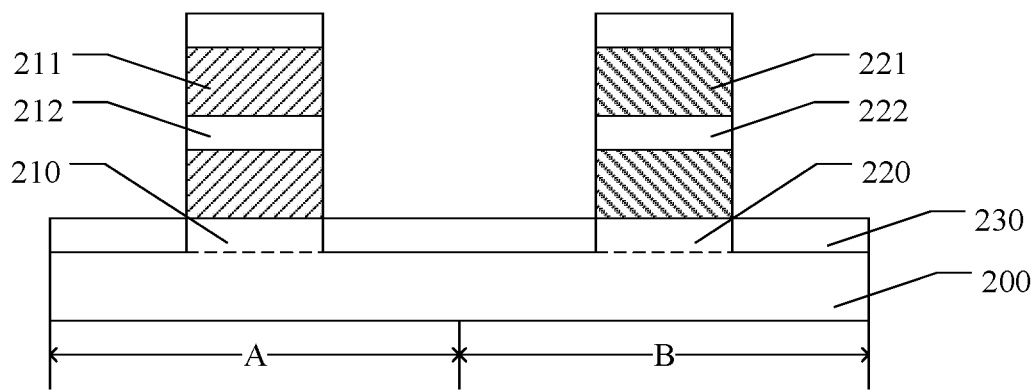
FIGS. 2-11 illustrate schematic cross-section views of semiconductor structures at certain stages of an exemplary method for fabricating a GAA FET device consistent with some embodiments of the present disclosure.

Referring to FIG. 12, a plurality of first stacked structures may be formed on a base substrate, and each first stacked structure may include a first sacrificial layer and a first semiconductor layer formed on the first sacrificial layer (S401). FIG. 2 illustrates a schematic cross-section view of a semiconductor structure consistent with some embodiments of the present disclosure.

Referring to FIG. 2, a base substrate may be provided. A plurality of first stacked structures (not labeled) may be formed on the base substrate. Each first stacked structure may include a first sacrificial layer 211 and a first semiconductor layer 212 formed on the first sacrificial layer 211.

The base substrate may include a substrate 200 including a core region A and a peripheral region B. The base substrate may also include a first fin structure 210 formed on the substrate 200 in the core region A, and an isolation structure 230 formed on the substrate 200 and covering the sidewall surfaces of the first fin structure 210. The plurality of first stacked structures may be formed on the first fin structure 210.

In one embodiment, the base substrate may further include a second fin structure 220 formed on the substrate 200 in the peripheral region B, and a plurality of second stacked structures formed on the second fin structure 220. Each second stacked structure may include a second sacrificial layer 221 and a second semiconductor layer 222 formed on the sacrificial layer 221. The isolation structure 230 may also cover the sidewall surfaces of the second fin structure 220.

For illustrative purposes, the semiconductor structure shown in FIG. 2 is described to have one first fin structure and one second fin structure formed on the base substrate, and have two first stacked structures formed on the first fin structure and two second stacked structures formed on the second fin structure. In other embodiments, the number of the first fin structure and/or the number of the second fin structure included in the semiconductor structure may be more than one. In addition, the number of the first stacked structures formed on a first fin structure may be other than 2 and/or the number of the second stacked structures formed on a second fin structure may be other than 2. For example, the semiconductor structure may have 1 or 3 first stacked structures formed on the first fin structure, and 1 or 3 second stacked structures formed on the second fin structure.

The substrate 200 may be made of single-crystalline silicon, polycrystalline silicon, or amorphous silicon. In some other embodiments, the substrate 200 may be made of germanium, SiGe, GaAs, or any other appropriate semiconductor material. Alternatively, the substrate 200 may be a bulk material or may have a composite semiconductor structure, such as silicon on insulator (SOI).

In one embodiment, the first fin structure 210 and the second fin structure 220 may be formed by patterning the substrate 200. In other embodiments, a fin structure material layer may be formed on the substrate, and then the fin structure material layer may be patterned to form the first fin structure and the second fin structure.

In one embodiment, the first fin structure 210, the first sacrificial layer 211, and the first semiconductor layer 212 may be formed by a process including the following exemplary steps. A plurality of stacked material film structures may be formed on the substrate 200. Each stacked material film structure may include a first sacrificial material film and a first semiconductor material film formed on the first sacrificial material film. A patterned layer may be formed on the plurality of stacked material film structures. The patterned layer may define the positions and the shapes of the first fin structure 210 and the plurality of first stacked structures. The plurality of stacked material film structures and the substrate 200 may be etched using the patterned layer as an etch mask to form the first fin structure 210 from the top layer of the substrate 200 and also form the plurality of first stacked structures on the first fin structure 210. Each first stacked structure formed through the process described above may include a first sacrificial layer 211 and a first semiconductor layer 212 on the first sacrificial layer 211.

In one embodiment, the patterned layer may also define the positions and the shapes of the second fin structure 220, the second sacrificial layers 221, and the second semiconductor layers 222. When etching the plurality of stacked material film structures and the substrate 200 using the patterned layer as the etch mask, the second fin structure 220 and the plurality of second stacked structures on the second fin structure 220 may also be formed. Each second stacked structure formed through the process described above may include a second sacrificial layer 221 and a second semiconductor layer 222 on the second sacrificial layer 221.

In one embodiment, a hard mask material film may be formed on the plurality of stacked material film structures through an etching process, and accordingly, during the etching process using the patterned layer as the etch mask, a hard mask layer (not shown) may be formed on the plurality of first stacked structures.

The hard mask layer may be made of a material including one or more of SiON, SiCO, SiCN, and SiCON.

Affected by the etching process, the bottom width of the first fin structure 210 may be larger than or equal to the top width of the first fin structure 210. The bottom width of the first fin structure 210 may refer to a dimension of the first fin structure 210 at the bottom of the first fin structure 210 and in a direction parallel to the surface of the substrate 200 and perpendicular to the extending direction of the first fin structure 210. The top width of the first fin structure 210 may refer to a dimension of the first fin structure 210 at the top of the first fin structure 210 and in a direction parallel to the surface of the substrate 200 and perpendicular to the extending direction of the first fin structure 210.

In one embodiment, the top width of the first fin structure 210 and the top width of the second fin structure 220 may be equal to the bottom width of the first fin structure 210 and the bottom width of the second fin structure 220, respectively.

The first sacrificial layer 211 may be made of a material including one or more of SiB, SiGe, SiC, SiP, SiAs, SiGeB, SiCB, GaN, InAs, InP, and any other appropriate material. The first semiconductor layer 212 may be made of a material including one or more of SiB, SiGe, SiC, SiP, SiAs, SiGeB, SiCB, GaN, InAs, InP, and any other appropriate material. Moreover, the first sacrificial layer 211 and the first semiconductor layer 212 may be made of different materials.

The second sacrificial layer 221 may be made of a material including one or more of SiB, SiGe, SiC, SiP, SiAs, SiGeB, SiCB, GaN, InAs, InP, and any other appropriate material. The second semiconductor layer 222 may be made of a material including one or more of SiB, SiGe, SiC, SiP, SiAs, SiGeB, SiCB, GaN, InAs, InP, and any other appropriate material. Moreover, the second sacrificial layer 221 and the second semiconductor layer 222 may be made of different materials.

In one embodiment, the first sacrificial layer 211 and the second sacrificial layer 221 may be formed by a deposition process including one or more of physical vapor deposition (PVD), chemical vapor deposition (CVD), atomic layer deposition (ALD), etc. The first semiconductor layer 212 and the second semiconductor layer 222 may be formed by a deposition process including one or more of PVD, CVD, ALD, etc.

The isolation structure 230 may be formed by a process including the following exemplary steps. An initial isolation film may be formed on the substrate 200. The initial isolation film may cover the sidewall surfaces of the first fin structure 210, the sidewall surfaces of the second fin structure 220, the top and the sidewall surfaces of the plurality of first stacked structures, and the top and the sidewall surfaces of the plurality of second stacked structures. The initial isolation film may be planarized, and then be etched back until the plurality of first stacked structures and the plurality of second stacked structures are exposed. As such, the isolation structure 230 covering the sidewall surfaces of the first fin structure 210 and the second fin structure 220 may be formed.

The isolation structure 230 may be made of a material including one or more of $SiO_x$, $SiN_x$, and any other appropriate material. The isolation structure 230 may be formed by a deposition process including one or more of PVD, CVD, ALD, etc.

In one embodiment, prior to forming the isolation structure 230, a pad oxide layer (not shown) may be formed on the substrate to cover the sidewall surfaces of the first fin structure 210 and the second fin structure 220. After forming the isolation structure 230, the pad oxide layer may be located between the isolation structure 230 and the first fin structure 210 and also between the isolation structure 230 and the second fin structure 220. As such, the binding strength between the first fin structure 210 and the isolation structure 230 and between the second fin structure 220 and the isolation structure 230 may be improved.

The pad oxide layer may be formed by a deposition process or by an oxidation process.

In one embodiment, prior to further forming a first dummy gate structure, the fabrication process may also include forming a dummy gate oxide layer on the base substrate to cover the top and the sidewall surfaces of the plurality of first stacked structures.

Figure 3:
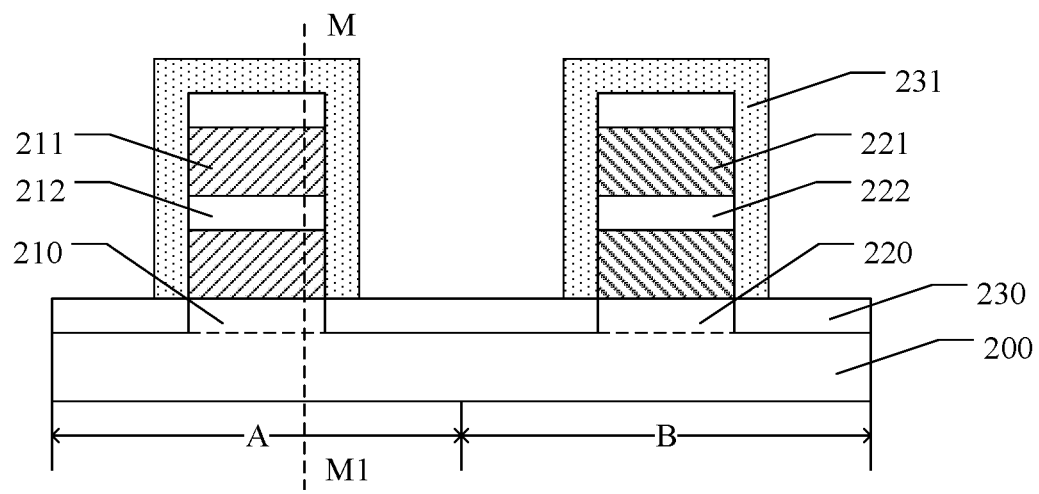
Figure 4:
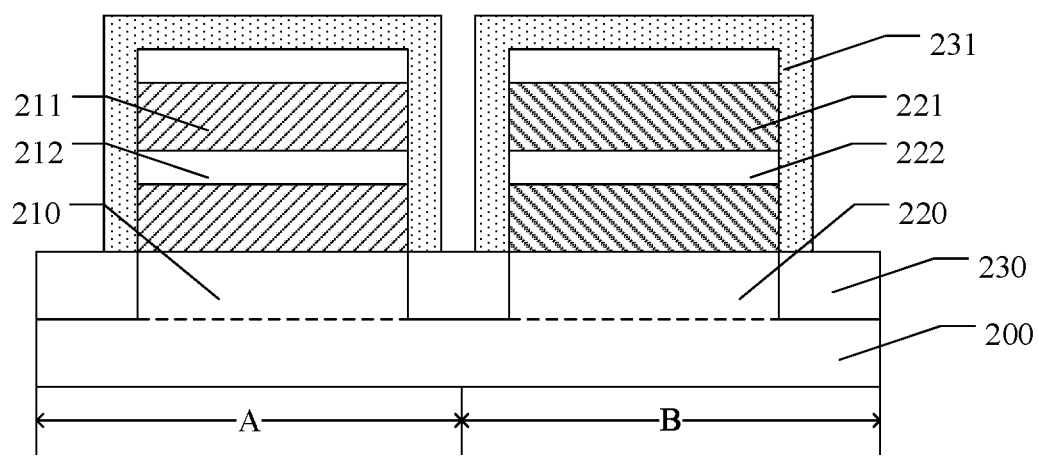

Further, returning back to FIG. 12, a dummy gate oxide layer may be formed on the base substrate to cover the top and the sidewall surfaces of the plurality of first stacked structures (S402). FIGS. 3-4 illustrate schematic cross-section views of a semiconductor structure consistent with some embodiments of the present disclosure. Specifically, FIG. 3 illustrates a schematic structural view processed from the structural view shown in FIG. 2, and FIG. 4 illustrates a schematic cross-section view of the semiconductor structure along an M-M1 line (referring to FIG. 3).

Referring to FIGS. 3-4, a dummy gate oxide layer 231 may be formed on the base substrate. The dummy gate oxide layer 231 may cover the top and sidewall surfaces of the plurality of first stacked structures.

In one embodiment, the dummy gate oxide layer 231 may also cover the top and the sidewall surfaces of the plurality of second stacked structures.

The dummy gate oxide layer 231 may be made of a material including $SiO_x$.

In one embodiment, the dummy gate oxide layer 231 may be formed by an in-situ steam generation (ISSG) process. The thickness of the dummy gate oxide layer 231 may be in a range of approximately 20 Å to 60 Å. The process parameters used in the ISSG process may include a temperature in a range of approximately 700° C. to 1200° C., a process gas including hydrogen and oxygen, a flowrate of oxygen in a range of approximately 1 slm to 50 slm, a flowrate of hydrogen in a range of approximately 1 slm to 10 slm, and a process time in a range of approximately 10 seconds to 5 minutes. The dummy gate oxide layer 231 formed through the ISSG process may demonstrate desired step coverage ability. Therefore, the dummy gate oxide layer 231 may be able to tightly cover the top and the sidewall surfaces of the plurality of first stacked structures and the second stacked structures. In addition, the dummy gate oxide layer 231 formed through the ISSG process may have a uniform thickness.

In other embodiments, the dummy gate oxide layer 231 may be formed by a chemical oxidation process. The chemical oxidation process may include the following exemplary steps. The top and the sidewall surfaces of the plurality of first stacked structures and the plurality of second stacked structures may be oxidized using an oxidization solution formed by introducing ozone into water. As such the dummy gate oxide layer 231 may be formed on the top and the sidewall surfaces of the plurality of first stacked structures and the plurality of second stacked structures. Moreover, when introducing ozone into water to form the oxidization solution, the concentration of the ozone in the oxidization solution may be in a range of approximately 1% to 15%.

In one embodiment, prior to forming the isolation structure 230, the dummy gate oxide layer 231 formed on the substrate 200 may cover the sidewall surfaces of the first fin structure 210, the top and the sidewall surfaces of the plurality of first stacked structures, the sidewall surfaces of the second fin structure 220, and the top and the sidewall surfaces of the plurality of second stacked structures.

Figure 5:
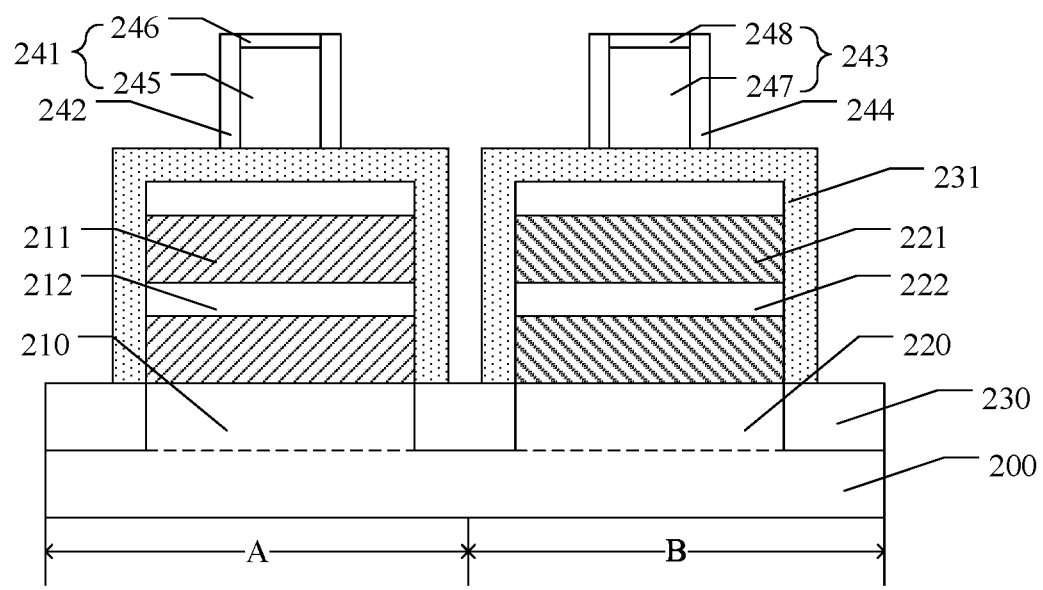

Further, returning back to FIG. 12, a first dummy gate structure may be formed across the plurality of first stacked structures, and a first sidewall spacer may be formed on each sidewall surface of the first dummy gate structure (S403). FIG. 5 illustrates a schematic cross-section view of a semiconductor structure consistent with some embodiments of the present disclosure. The schematic structural view shown in FIG. 5 may be processed from the schematic structural view shown in FIG. 4.

Referring to FIG. 5, a first dummy gate structure 241 may be formed across the plurality of first stacked structures, and a first sidewall spacer 242 may be formed on each sidewall surface of the first dummy gate structure 241. The first dummy gate structure 241 may cover a portion of the base substrate as well as a portion of the top and the sidewall surfaces of the plurality of first stacked structures.

In one embodiment, a second dummy gate structure 243 may be formed across the plurality of second stacked structures and a second sidewall spacer 244 may be formed on each sidewall surface of the second dummy gate structure 243. The second dummy gate structure 243 may cover a portion of the base substrate as well as a portion of the top and the sidewall surfaces of the plurality of second stacked structures.

The first dummy structure 241 may include a first dummy gate dielectric layer 245 formed across the plurality of first stacked structures, and a first dummy gate electrode layer 246 formed on the first dummy gate dielectric layer 245. The second dummy structure 242 may include a second dummy gate dielectric layer 247 formed across the plurality of second stacked structures, and a second dummy gate electrode layer 248 formed on the second dummy gate dielectric layer 247. The first dummy gate dielectric layer 245 may cover a portion of the surface of the isolation structure 230 in the core region A and a portion of the top and the sidewall surfaces of the plurality of first stacked structures. The second dummy gate dielectric layer 247 may cover a portion of the surface of the isolation structure 230 in the peripheral region B and a portion of the top and the sidewall surfaces of the plurality of second stacked structures.

The first dummy gate dielectric layer 245 and the second dummy gate dielectric layer 247 may be made of a material including one or more of $SiO_x$, $SiN_x$, and SiON. The first dummy gate electrode layer 246 and the second dummy gate electrode layer 248 may be made of a material including one or more of single-crystalline silicon, amorphous silicon, polycrystalline silicon, doped polycrystalline silicon, polycrystalline Si—Ge alloy, and metal silicide formed from polycrystalline silicon.

The first sidewall spacer 242 and the second sidewall spacer 244 may be formed by a process including the following exemplary steps. A sidewall spacer film may be formed on the isolation structure 230 to cover the plurality of first stacked structures, the plurality of second stacked structures, the dummy gate oxide layer 231, the first dummy gate structure 241, and the second dummy gate structure 243. The sidewall spacer film may be etched back to expose the top surfaces of the first dummy gate structure 241 and the second dummy gate structure 243. As such, the first sidewall spacer 242 and the second sidewall spacer 244 may be formed.

The sidewall spacer film may be formed by a deposition process including one or more of PVD, CVD, ALD, etc.

The first sidewall spacer 242 and the second sidewall spacer 244 maybe made of a material including one or more of $SiO_x$, $SiN_x$, and SiON.

Figure 6:
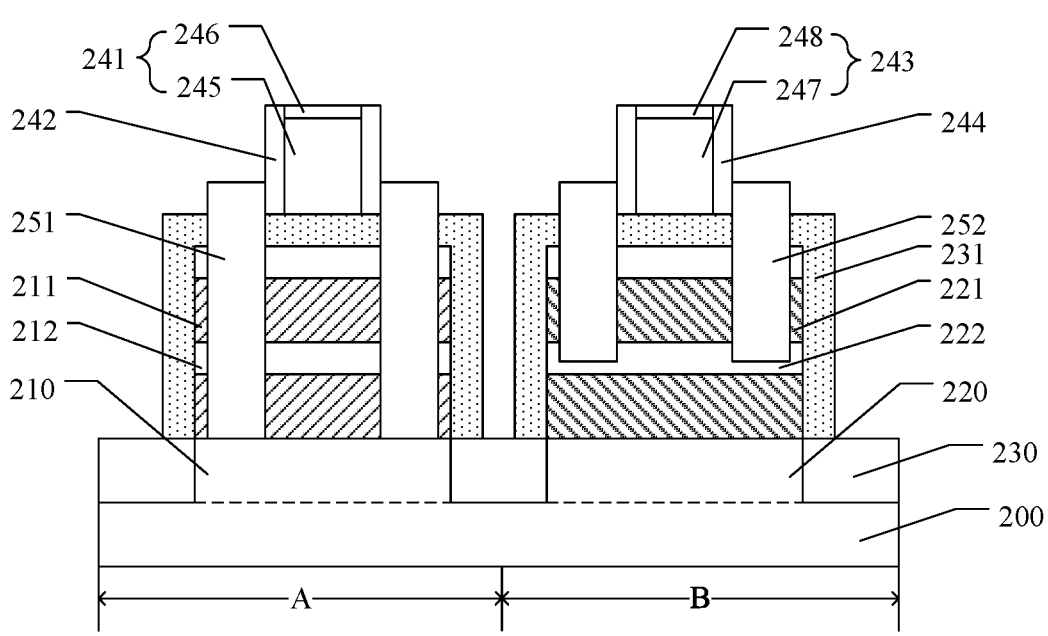

Further, returning to FIG. 12, a first source/drain doped layer may be formed in the plurality of first stacked structures on each side of the first dummy gate structure and separated from the first dummy gate structure by a first sidewall spacer (S404). FIG. 6 illustrates a schematic cross-section view of a semiconductor structure consistent with some embodiments of the present disclosure.

Referring to FIG. 6, a first source/drain doped layer 251 may be formed in the plurality of first stacked structures on each side of the first dummy gate structure 241. That is, the first source/drain doped layer 251 may be formed in the plurality of first stacked structures on each side of the first dummy gate structure 241. The first source/drain doped layer 251 may be separated from the first dummy gate structure 241 by a first sidewall spacer 242.

In one embodiment, a second source/drain doped layer 252 may be formed in the plurality of second stacked structures on each side of the second dummy gate structure 243. That is, the second source/drain doped layer 252 may be formed in the plurality of second stacked structures on each side of the second dummy gate structure 243. The second source/drain doped layer 252 may be separated from the second dummy gate structure 243 by a second sidewall spacer 244.

The first source/drain doped layer 251 and the second source/drain doped layer 252 may contain doped ions. The concentration of the doped ions in the first source/drain doped layer 251 and the concentration of the doped ions in the second source/drain doped layer 252 may both be in a range of approximately $5.0E20$ atom/cm$^3$ to $1.0E22$ atom/cm$^3$.

In one embodiment, the process for forming the first source/drain doped layer 251 may include the following exemplary steps. A first source/drain trench (not shown) may be formed in the plurality of first stacked structures on each side of the first dummy gate structure 241 and separated from the first dummy gate structure 241 by a first sidewall spacer 242. The first source/drain doped layer 251 may then be formed in the two first source/drain trenches.

The first source/drain doped layer 251 in the first source/drain trenches may be formed by an epitaxial growth process. The doping ions may be implanted into the first source/drain doped layer 251 through an in-situ ion implantation process.

In one embodiment, the transistor to be formed may be a P-type metal-oxide-semiconductor (PMOS) transistor. The process gas used in the epitaxial growth process may include $H_2$, HCl, $Cl_2H_2Si$, and $PH_3$; the process temperature may be in a range of approximately 650° C. to 850° C.; and the doping ions may include P-type ions.

In some other embodiments, after forming the first source/drain trench, a stress layer may be formed in the first source/drain trench through a selective epitaxial deposition process. The doping ions may be doped into the stress layer to form the first source/drain doped layer. When the GAA FET device to be formed is a PMOS transistor device, the stress layer may be made of SiGe, the doping ions doped into the stress layer may be P-type ions, and the stress layer may be an Σ-type stress layer, i.e, the cross-section of the stress layer may have an Σ shape. When the GAA FET device to be formed is an N-type metal-oxide-semiconductor (NMOS) transistor device, the stress layer may be made of SiC, and the doping ions doped into the stress layer may be N-type ions.

In one embodiment, the bottom of the first source/drain trench may expose the first fin structure 210, and thus the first source/drain doped layer 251 may also be located on the first fin structure 210.

In other embodiments, the bottom of the first source/drain trench may expose the first sacrificial layer 211.

In one embodiment, the process for forming the second source/drain doped layer 252 may include the following exemplary steps. A second source/drain trench (not shown) may be formed in the plurality of second stacked structures on each side of the second dummy gate structure 243 and separated from the second dummy gate structure 243 by a second sidewall spacer 244. The second source/drain doped layer 252 may then be formed in the two second source/drain trenches.

In one embodiment, the bottom of the second source/drain trench may expose the second sacrificial layer 221.

The distance from the bottom of the second source/drain doped layer 252 to the base substrate may be in a range of approximately 200 Å to 500 Å. The second source/drain doped layer 252 may be located in the peripheral region B of the substrate 200. When the width of the channel between the two portions of the second source/drain doped layer 252 becomes smaller and smaller, the width of the depletion layer of the second source/drain doped layer 252 may extend towards the channel direction with an increasing voltage. Therefore, by adjusting the distance between the bottom of the second source/drain doped layer 252 and the base substrate, the risk of punching through the transistor may be reduced.

Figure 7:
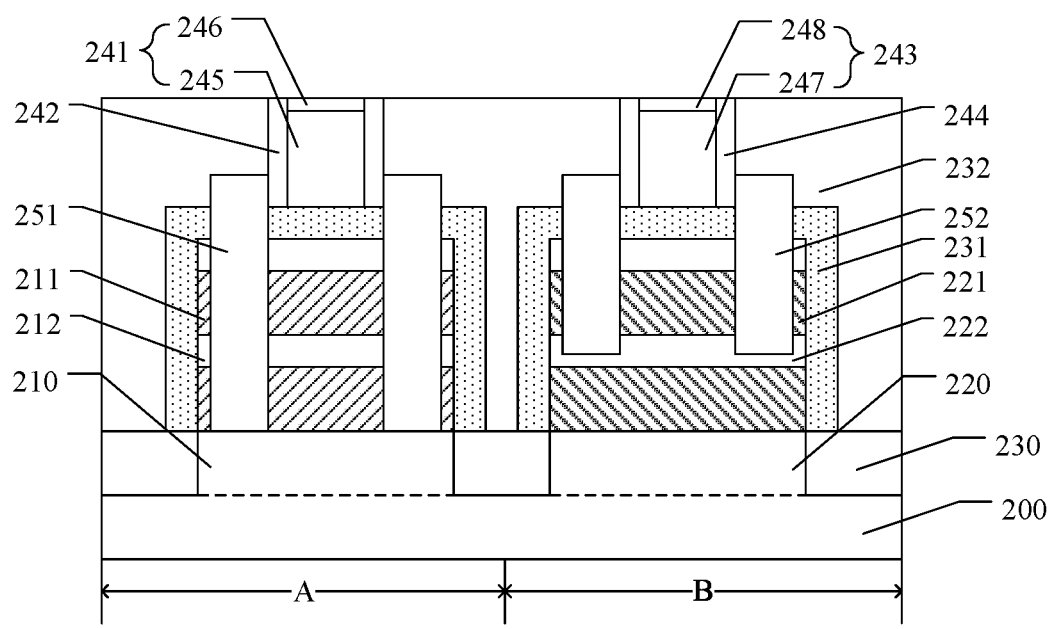

Further, returning to FIG. 12, a dielectric structure may be formed on the base substrate to cover the plurality of first stacked structures and the first source/drain doped layer, the dielectric structure may expose the top surfaces of the first dummy gate structure and the first sidewall spacer (S405). FIG. 7 illustrates a schematic cross-section view of a semiconductor structure consistent with some embodiments of the present disclosure.

Referring to FIG. 7, a dielectric structure 232 may be formed on the base substrate. The dielectric structure 232 may cover the plurality of first stacked structures and the first source/drain doped layer 251. In addition, the dielectric structure 232 may expose the top surfaces of the first dummy gate structure 241 and the first sidewall spacer 242.

The dielectric structure 232 may also cover the plurality of second stacked structures and the second source/drain doped layer 252, and may expose the top surfaces of the second dummy gate structure 243 and the second sidewall spacer 244.

In one embodiment, the dielectric structure 232 may include a first dielectric layer 233 and a second dielectric layer 234 formed on the first dielectric layer 233.

The hardness of the second dielectric layer 234 may be larger than the hardness of the first dielectric layer 233. The second dielectric layer 234 may be used to protect the first dielectric layer 233 during a subsequently performed planarization process. In the meantime, the second dielectric layer 234 may also be able to ensure high uniformity of a subsequently formed first gate structure.

The process for forming the dielectric structure 232 may include the following exemplary steps. A first dielectric film covering the first source/drain doped layer 251, the first dummy gate structure 241, the second source/drain doped layer 252, the second dummy gate structure 243, the plurality of first stacked structures, and the plurality of second stacked structures may be formed on the isolation structure 230. A second dielectric film may then be formed on the first dielectric film. The hardness of the second dielectric film may be larger than the hardness of the first dielectric film. Further, the first dielectric film and the second dielectric film may be planarized until the top surfaces of the first dummy gate structure 241 and the second dummy gate structure 242 are exposed.

The first dielectric film and the second dielectric film may be formed by a deposition process including one or more of CVD, PVD, ALD, etc.

The first dielectric film and the second dielectric film may be made of a material including one or more of $SiO_x$, $SiN_x$, SiON, low-k dielectric material (for example, a dielectric material with a relative dielectric constant larger than 2.5 but smaller than 3.9, such as porous silicon oxide, porous silicon nitride, etc.), ultra-low-k dielectric material (for example, a dielectric material with a relative dielectric smaller than 2.5, such as porous SiCOH, etc.).

Figure 8:
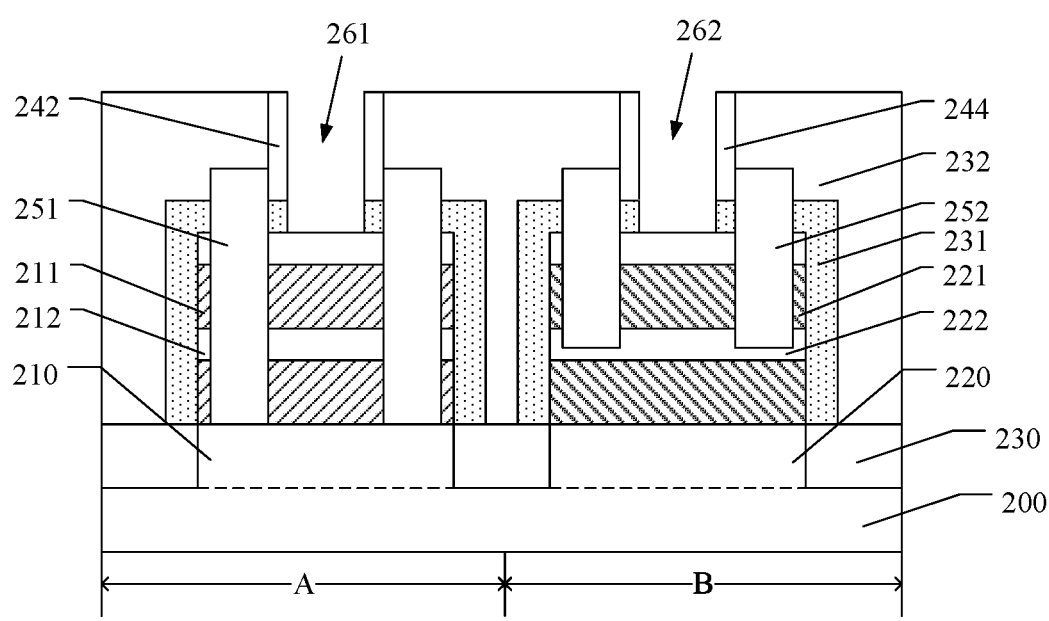

Returning to FIG. 12, the first dummy gate structure may be removed to form a first trench in the dielectric structure (S406). FIG. 8 illustrates a schematic cross-section view of a semiconductor structure consistent with some embodiments of the present disclosure.

Referring to FIG. 8, the first dummy gate structure 271 (referring to FIG. 7) may be removed to form a first trench 261 in the dielectric structure 232.

In one embodiment, during the removal process of the first dummy gate structure 241, the second dummy gate structure 243 (referring to FIG. 8) may also be removed to form a second trench 262 in the dielectric structure 232. The first dummy gate structure 241 and the second dummy gate structure 243 may be removed by an etching process.

In one embodiment, after forming the first trench 261, the fabrication process may further include removing the dummy gate oxide layer 231 on the bottom of the first trench 261.

The dummy gate oxide layer 231 may be removed by a wet etching process, a dry etching process, or an etching process combining both wet etching and dry etching.

In one embodiment, when removing the first dummy gate structure 241 and the second dummy gate structure 243, the portion of the dummy gate oxide layer formed on the bottom of the first trench 261 and the bottom of the second trench 262 may be removed.

In one embodiment, a dry etching process may be performed to remove the first dummy gate electrode layer 246 and the second dummy gate electrode layer 248, and a wet etching process may then be performed to remove the first dummy gate dielectric layer 245 and the second dummy gate dielectric layer 247. By using the method described above, the damage to the first sidewall spacer 242 and the second sidewall spacer 244 may be reduced. In addition, the method may also prevent the polymer produced in the dry etching process from reducing the electrical performance of the gate-effect transistor.

In some other embodiments, a dry etching process may be performed to remove a top portion of the first dummy gate electrode layer 246 and the second dummy gate electrode layer 248. For example, the removed portion of the first dummy gate electrode layer 246 and the second dummy gate electrode layer 248 may correspond to 70%-80% of the thickness of the first dummy gate electrode layer 246 and the thickness of the second dummy gate electrode layer 248. Further, a wet etching process may be performed to remove the remaining portion of the first dummy gate electrode layer 246 and the second dummy gate electrode layer 248. The dry etching process may use an etching gas including one or more of $Cl_2$, HBr, and $O_2$.

Figure 9:
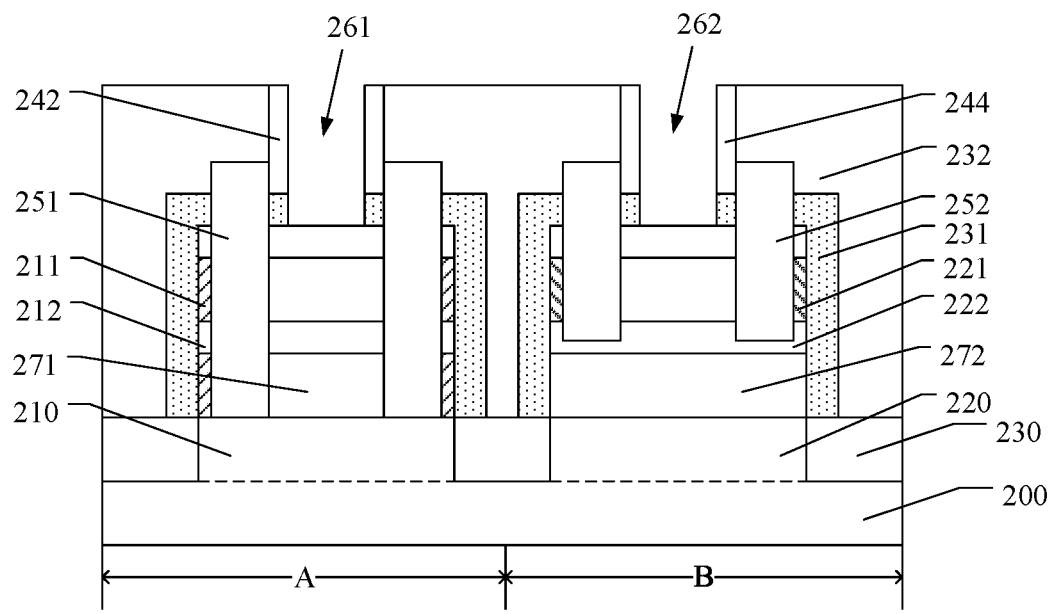

Further, returning to FIG. 12, the portion of each first sacrificial layer on the bottom of the first trench may be removed to form a first via under a corresponding first semiconductor layer, the sidewall surfaces of the first via exposing a portion of the first source/drain doped layer (S407). FIG. 9 illustrates a schematic cross-section view of a semiconductor structure consistent with some embodiments of the present disclosure.

Referring to FIG. 9, the portion of each first sacrificial layer 211 on the bottom of the first trench 261 may be removed to form a first via 271 under a corresponding first semiconductor layer 212. The sidewall surfaces of the first via 271 may expose a bottom portion of the first source/drain doped layer 251.

In one embodiment, prior to forming the second source/drain doped layer 272, the bottom of the second source/drain trench may expose the second sacrificial layer 221, and when removing the portion of each first sacrificial layer 211 to form the first via 271, the portion of each second sacrificial layer 221 on the bottom of the second trench 262 may be removed to form a second via 272, and the formed second via 272 may expose a bottom portion of the second source/drain doped layer 252.

In some other embodiments, prior to forming the first source/drain doped layer, the bottom of the first source/drain trench may expose the first sacrificial layer. Therefore, the first via may expose a bottom portion of the first source/drain doped layer.

The first via 271 may be formed by an etching process. In one embodiment, the first via 271 may be formed by a wet etching process. For example, based on the material of the first sacrificial layer 211, an etching gas may be properly selected to ensure a selective etching ratio between the first sacrificial layer 211 and the first semiconductor layer 212. As such, in the process of removing the first sacrificial layer 211, damage to the first semiconductor layer 212 may be reduced.

In one embodiment, the etching solution used in the wet etching process may include HCl.

In some other embodiments, the first via 271 may be formed by a vapor etching process. The process parameters adopted in the vapor etching process may include an etching gas including HCl, a flow rate of HCl in a range of approximately 5 sccm to 1000 sccm, an etching temperature in a range of approximately 0° C. to 300° C., and a process pressure in a range of approximately 0.5 torr to 760 torr.

Alternatively, the etching gas adopted in the vapor etching process may include one or both of $CF_4$ and HBr.

Figure 10:
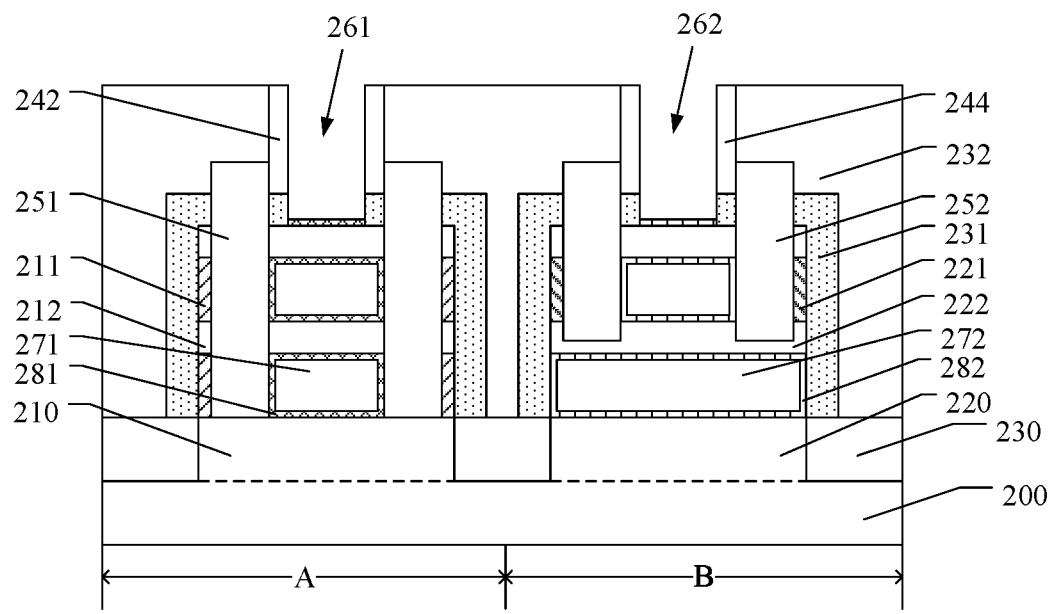

Returning to FIG. 12, a first barrier layer may be formed on the portion of the first source/drain doped layer exposed by the first via (S408). FIG. 10 illustrates a schematic cross-section view of a semiconductor structure consistent with some embodiments of the present disclosure.

Referring to FIG. 10, a first barrier layer 281 may be formed on the portion of the first source/drain doped layer 251 exposed by the first via 271. In one embodiment, the first barrier layer 281 may be located between the first source/drain doped layer 251 and a subsequently-formed first gate structure, and may be used to prevent the doping ions in the first source/drain doped layer 251 from diffusing into the subsequently-formed first gate structure. As such, the risk of junction leakage due to interfacial defects of the first source/drain doped layer 251 may be avoided. Therefore, the electrical performance of the GAA FET device may be improved.

In one embodiment, the first barrier layer 281 may also cover the inner sidewall surfaces of the first via 271 and the bottom surface of the first trench 261.

In one embodiment, a second barrier layer 282 may be formed on the portion of the second source/drain doped layer 252 exposed by the second via 272. The second barrier layer 282 may also cover the inner sidewall surfaces of the second via 272 and the bottom surface of the second via 262.

The thickness of the first barrier layer 281 and the thickness of the second barrier layer 282 may both be in a range of approximately 8 Å to 45 Å.

In one embodiment, the thickness of the first barrier layer is in a range of approximately 8 Å to 25 Å, for example, 15 Å. When the GAA FET device is in a high-voltage operation state, reduction of the junction barriers of the first source/drain doped layer 251 and the second source/drain doped layer 252 may be easily induced due to the high-intensity electric field. Therefore, the threshold voltage of the GAA FET device may be reduced. By controlling the thickness of the first barrier layer 281 and the thickness of the second barrier layer 282, the capacitance between the first source/drain doped layer 251 and the subsequently-formed first gate structure as well as the capacitance between the second source/drain doped layer 252 and the subsequently-formed second gate structure may be adjusted. As such, the risk of reducing the threshold voltage may be avoided, and the electrical performance of the GAA FET device may be improved.

The first barrier layer 281 and the second barrier layer 282 may be made of a material including $SiO_x$ or SiON. The first barrier layer 281 and the second barrier layer 282 may be formed by a deposition process or by an oxidation process.

In one embodiment, the first barrier layer 281 and the second barrier layer 282 may be formed by an ISSG process. The process parameters adopted in the ISSG process may include a temperature in a range of approximately 700° C. to 1200° C., a gas including hydrogen gas and oxygen gas, a flow rate of the oxygen gas in a range of approximately 1 slm to 50 slm, a flow rate of the hydrogen gas in a range of approximately 1 slm to 10 slm, and a processing time in a range of approximately 10 seconds to 5 minutes. The first barrier layer 281 and the second barrier layer 282 formed by the ISSG process may demonstrate desired step coverage ability and filling ability.

In one embodiment, prior to forming the second source/drain doped layer 272, the bottom of the second source/drain trench may expose the second sacrificial layer 221, and after forming the second via 272, the second via 272 may expose a bottom portion of the second source/drain doped layer 252. Therefore, the second barrier layer 282 may also be formed on the bottom of the second source/drain trench. In some other embodiments, prior to forming the first source/drain doped layer, the bottom of the first source/drain trench may expose the first sacrificial layer, and after forming the first via, the first via may expose a bottom portion of the first source/drain doped layer. Therefore, the first barrier layer may also be formed on the bottom of the first source/drain trench.

Further, returning to FIG. 12, a first gate structure may be formed to fill the first trench and the first via (S409). FIG. 10 illustrates a schematic cross-section view of a semiconductor structure consistent with some embodiments of the present disclosure.

Figure 11:
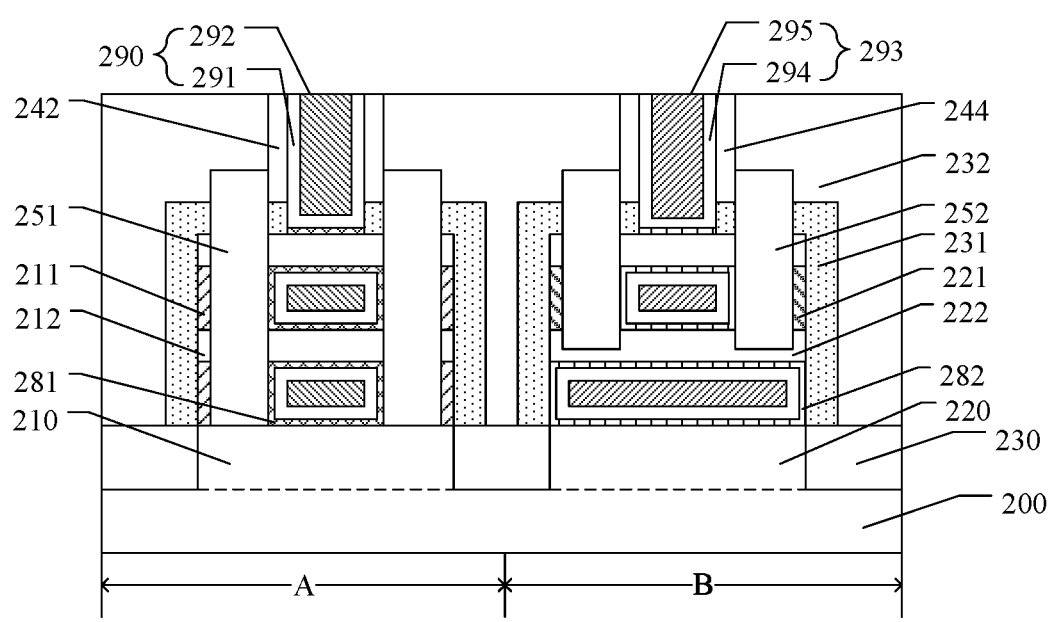
Figure 12:
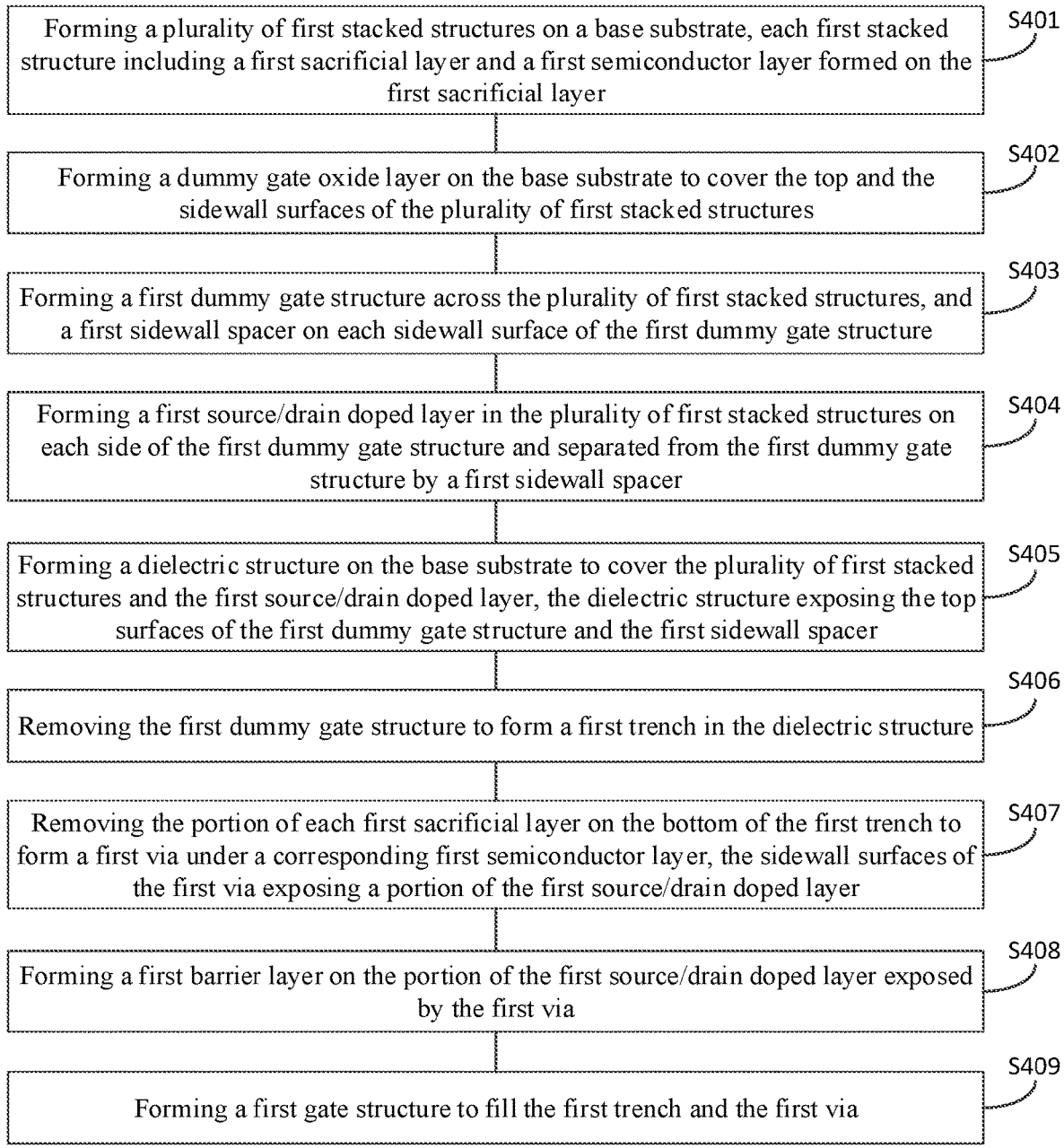
FIG. 12 illustrates a flowchart of the exemplary method for fabricating a semiconductor device consistent with some embodiments of the present disclosure.

Referring to FIG. 11, a first gate structure 290 may be formed by filling the first trench 261 (referring to FIG. 10) and the first via 271 (referring to FIG. 10).

The first gate structure 290 may include a first gate dielectric layer 291 formed on the surface of the first battier layer 281 and a first gate electrode layer 292 formed on the first gate dielectric layer 291. Moreover, the first gate electrode layer 292 may fill the first trench 261 and the first via 271.

In the process of forming the first gate structure 290, a second gate structure 293 may be formed by filling the second trench 262 and the second via 272. The second gate structure 293 may include a second gate dielectric layer 294 formed on the surface of the second battier layer 282 and a second gate electrode layer 295 formed on the second gate dielectric layer 294. Moreover, the second gate electrode layer 295 may fill the second trench 262 and the second via 272.

The first gate dielectric layer 291 and the second gate dielectric layer 294 may be made of a material including a high-k dielectric material (i.e., a material with a relative dielectric constant larger than 3.9). For example, the high-k dielectric material may include $HfO_x$, $ZrO_x$, HfSiO, $LaO_x$, ZrSiO, $TiO_x$, $TaO_x$, $(Ba,Sr)TiO_3$, $BaTiO_3$, $SrTiO_3$, $Al_2O_3$, etc.

The first gate dielectric layer 291 and the second gate dielectric layer 294 may be formed by a process including at least one of CVD and ALD.

The first gate electrode layer 292 and the second gate electrode layer 295 may be made of a metal material. The metal material may include one or more of Cu, W, Ni, Cr, Ti, Ta, Al, etc.

In one embodiment, a work function layer (not shown) may be formed between the first gate dielectric layer 291 and the first gate electrode layer 292, and also between the second gate dielectric layer 294 and the second gate electrode layer 295.

Further, the present disclosure also provides a GAA FET device formed by the method described above. FIG. 11 illustrates a schematic cross-section view of an exemplary GAA FET device consistent with some embodiments of the present disclosure.

Referring to FIG. 11, the GAA FET device may include a base substrate and a plurality of first stacked structures formed on the base substrate. Each first stacked structure may include a first semiconductor layer 212 and a first via (not shown) under the first semiconductor layer 212. The GAA FET device may also include a first gate structure 290 formed across the plurality of first stacked structures and a first sidewall spacer 242 formed on each sidewall surface of the first gate structure 290. The first gate structure 290 may cover a portion of the base substrate as well as a portion of the top and the sidewall surfaces of the plurality of first stacked structures. The first gate structure 290 may also fill up the first via of each first stacked structure. The GAA FET device may further include a first source/drain doped layer 251 formed in the plurality of first stacked structures on each side of the first gate structure 290 and separated from the first gate structure by a first sidewall spacer 242, a first barrier layer 281 formed between the first source/drain doped layer 251 and the first gate structure 290, and a dielectric structure 232 formed on the base substrate. The dielectric structure 232 may cover the first source/drain doped layer 251 and expose the top surfaces of the first sidewall spacer 242 and the first gate structure 290.

In one embodiment, the base substrate may include a substrate 200 including a core region A and a peripheral region B. The base substrate may also include a first fin structure 210 formed on the substrate 200 in the core region A, and an isolation structure 230 formed on the substrate 200 and covering the sidewall surfaces of the first fin structure 210. The plurality of first stacked structures may be formed on the first fin structure 210.

In one embodiment, the base substrate may further include a second fin structure 220 formed on the substrate 200 in the peripheral region B, and a plurality of second stacked structures formed on the second fin structure 220. Each second stacked structure may include a second semiconductor layer 222 and a second via (not shown) under the second semiconductor layer 222. The GAA FET device may also include a second gate structure 293 formed across the plurality of second stacked structures and a second sidewall spacer 244 formed on each sidewall surface of the second gate structure 293. The second gate structure 293 may cover a portion of the base substrate as well as a portion of the top and the sidewall surfaces of the plurality of second stacked structures. The second gate structure 293 may also fill up the second via of each second stacked structure. The GAA FET device may further include a second source/drain doped layer 252 formed in the plurality of second stacked structures on each side of the second gate structure 293 and separated from the second gate structure 293 by a second sidewall spacer 244, and a second barrier layer 282 formed between the second source/drain doped layer 252 and the second gate structure 293. The dielectric structure 232 may also cover the second source/drain doped layer 252 and expose the top surfaces of the second sidewall spacer 244 and second first gate structure 293.

In one embodiment, the second via may also expose a bottom portion of the second source/drain doped layer 252, and the second gate structure 293 may also be formed under the second source/drain doped layer 252.

The first barrier layer 281 and the second barrier layer 282 may be made of a material including $SiO_x$ or SiON. In one embodiment, the materials, the dimensions, and the structures of the first barrier layer 281 and the second barrier layer 282 may be referred to the corresponding description in various embodiments provided above.

In one embodiment, the first source/drain doped layer 251 and the second source/drain doped layer 252 may contain doped ions. The concentrations of the doped ions in the first source/drain doped layer 251 and the second source/drain doped layer 252 may be in a range of approximately 5.0E20 atom/$cm^3$ to 1.0E22 atom/$cm^3$. The materials, the dimensions, and the structures of the first source/drain doped layer 251 and the second source/drain doped layer 252 may be referred to the corresponding description in various embodiments provided above.

Compared to conventional GAA FET devices and fabrication methods, the disclosed GAA FET devices and fabrication methods may demonstrate the following advantages.

According to the disclosed GAA FET devices and fabrication methods, the first dummy gate structure is removed to form a first trench in the dielectric structure. The portion of the first sacrificial layer exposed by the first trench is removed to form a first via under the plurality of first semiconductor layers. The sidewall surfaces of the first via expose a portion of the first source/drain doped layer. A first barrier layer is then formed on the portion of the first source/drain doped layer exposed in the first via. The first gate structure may be formed by filling up the first trench and the first via. The first barrier layer is formed between the first source/drain doped layer and the first gate structure. The first barrier layer is used to prevent the doping ions in the first source/drain doped layer from diffusing into the first gate structure. As such, the risk of junction leakage due to interfacial defects of the first source/drain doped layer may be avoided. Therefore, the electrical performance of the GAA FET device may be improved.

Further, the thickness of the first barrier layer is in a range of approximately 8 Å to 45 Å. When the GAA FET device is in a high-voltage operation state, reduction of the junction barrier of the first source/drain doped layer may be easily induced due to the high-intensity electric field. Therefore, the threshold voltage of the GAA FET device may be reduced. By controlling the thickness of the first barrier layer, the capacitance between the first source/drain doped layer and the subsequently-formed first gate structure may be adjusted. As such, the risk of reducing the threshold voltage may be avoided, and the electrical performance of the GAA FET device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a gate-all-around (GAA) field-effect-transistor (FET) device, comprising:
   providing a base substrate and forming a plurality of first stacked structures on the base substrate, wherein each first stacked structure includes a first sacrificial layer and a first semiconductor layer formed on the first sacrificial layer;
   forming a first dummy gate structure across the plurality of first stacked structures, and a first sidewall spacer on each sidewall surface of the first dummy gate structure, wherein the first dummy gate structure is formed on a portion of the base substrate and covers a portion of a top surface and a portion of each sidewall surface of the plurality of first stacked structures;
   forming a first source/drain doped layer in the plurality of first stacked structures on each side of the first dummy gate structure and separated from the first dummy gate structure by a first sidewall spacer;
   forming a dielectric structure on the base substrate to cover the plurality of first stacked structures and the first source/drain doped layer, wherein the dielectric structure exposes a top surface of the first dummy gate structure and a top surface of each first sidewall spacer;
   removing the first dummy gate structure to form a first trench in the dielectric structure;
   removing a portion of the first sacrificial layer exposed in the first trench to form a first via under the first semiconductor layer, wherein sidewalls of the first via expose a portion of the sidewalls of the first source/drain doped layer;
   forming a first barrier layer directly on a portion of the sidewalls of the first source/drain doped layer exposed by the first via; and
   forming a first gate structure to fill the first trench and the first via.

2. The method according to claim 1, wherein:
   the base substrate includes a substrate including a core region, a first fin structure formed in the core region, and an isolation structure covering sidewall surfaces of the first fin structure, wherein the plurality of first stacked structures are formed on the first fin structure.

3. The method according to claim 2, wherein forming the first source/drain doped layer includes:
   forming a first source/drain trench in the plurality of first stacked structures on each side of the first dummy gate structure and separated from the first dummy gate structure by a first sidewall spacer; and
   forming the first source/drain doped layer, containing doped ions, in the first source/drain trench.

4. The method according to claim 3, wherein:
   forming the first source/drain doped layer in the first source/drain trench includes an epitaxial growth process; and
   the doping ions are implanted into the first source/drain doped layer through an in-situ ion implantation process.

5. The method according to claim 4, wherein:
   a process gas used in the epitaxial growth process includes $H_2$, HCl, $Cl_2H_2Si$, and $PH_3$;
   a process temperature of the epitaxial growth process is in a range of approximately 650° C. to 850° C.; and
   the doped ions include P-type ions.

6. The method according to claim 3, wherein, and:
   a bottom of the first source/drain trench exposes the first sacrificial layer;
   the first via also exposes a bottom portion of the first source/drain doped layer; and
   the first barrier layer is also formed on the bottom of the first source/drain trench.

7. The method according to claim 3, prior to performing the self-aligned silicide process, further including:
   a bottom of the first source/drain trench exposes the first fin structure; and
   the first source/drain doped layer is formed on the first fin structure.

8. The method according to claim 3, wherein the substrate further includes a peripheral region, and a second fin structure formed in the peripheral region, the isolation structure also covering sidewall surfaces of the second fin structure, and the method further includes:
   forming a plurality of second stacked structures on the second fin structure, wherein each second stacked structure includes a second sacrificial layer, and a second semiconductor layer formed on the second sacrificial layer,
   forming a second dummy gate structure across the plurality of second stacked structures, and a second sidewall spacer on each sidewall surface of the second dummy gate structure, wherein the second dummy gate structure is formed on a portion of the base substrate and covers a portion of a top surface and a portion of each sidewall surface of the plurality of second stacked structures;

prior to forming the dielectric structure on the base substrate, forming a second source/drain doped layer in the plurality of second stacked structures on each side of the second dummy gate structure and separated from the second dummy gate structure by a second sidewall spacer, wherein after forming the dielectric structure, the dielectric structure also covers the plurality of second stacked structures and the second source/drain doped layer and exposes top surfaces of the second dummy gate structure and the second sidewall spacers;

removing the second dummy gate structure to form a second trench in the dielectric structure;

removing a portion of the second sacrificial layer exposed in the second trench to form a second via under the second semiconductor layer, sidewalls of the second via exposing a portion of the second source/drain doped layer;

forming a second barrier layer on a portion of the second source/drain doped layer exposed by the second via; and forming a second gate structure to fill the second trench and the second via.

9. The method according to claim 8, wherein:
forming the second source/drain doped layer includes:
   forming a second source/drain trench in the plurality of second stacked structures on each side of the second dummy gate structure and separated from the second dummy gate structure by a second sidewall spacer, wherein a bottom of the second source/drain trench exposes the second sacrificial layer, and
   forming the second source/drain doped layer, containing doped ions, in the second source/drain trench;
the second via also exposes bottom portion of the second source/drain doped layer; and
the second barrier layer is also formed on the bottom of the second source/drain trench.

10. The method according to claim 8, wherein:
the second source/drain doped layer has a bottom formed in the second semiconductor layer and cuts through the second sacrificial layer.

11. The method according to claim 1, wherein:
the first sacrificial layer is made of a material including at least one of SiB, SiGe, SiC, SiP, SiAs, SiGeB, SiCB, GaN, InAs, and InP;
the first semiconductor layer is made of a material including at least one of SiB, SiGe, SiC, SiP, SiAs, SiGeB, SiCB, GaN, InAs, and InP, wherein:
   the first semiconductor layer and the first sacrificial layer are made of different materials.

12. The method according to claim 1, wherein:
the first barrier layer is made of a material including one of $SiO_x$ and SiON.

13. The method according to claim 12, wherein:
a thickness of the first barrier layer is in a range of approximately 8 Å to 45 Å.

14. The method according to claim 1, wherein:
the first via is formed by a wet etching process.

15. The method according to claim 14, wherein:
an etching solution used in the wet etching process includes HCl.

16. The method according to claim 1, wherein:
the first source/drain doped layer contains doping ions; and
a concentration of the doping ions in the first source/drain doped layer is in a range of approximately 5.0E20 atom/cm$^3$ and 1.0E22 atom/cm$^3$.

17. The method according to claim 1, prior to forming the first dummy gate structure, further including:
forming a dummy gate oxide layer on the base substrate to cover a portion of the top surface and a portion of each sidewall surface of the plurality of first stacked structures.

18. The method according to claim 17, after forming the first trench, further including:
removing a portion of the dummy gate oxide layer formed on the bottom of the first trench.

19. The method according to claim 1, wherein:
the first source/drain doped layer is formed directly on the base substrate and cuts through the first sacrificial layer and the first semiconductor layer, and
the sidewalls of the first source/drain doped layer are coplanar with sidewalls of the first sidewall spacer.

* * * * *